United States Patent
Patel et al.

(10) Patent No.: US 10,101,363 B2
(45) Date of Patent: Oct. 16, 2018

(54) COAXIAL CONNECTOR LOCKING BRACKET

(71) Applicant: Keysight Technologies, Inc., Minneapolis, MN (US)

(72) Inventors: Kamlesh Patel, Santa Rosa, CA (US); Scott Henigan, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 256 days.

(21) Appl. No.: 14/684,425

(22) Filed: Apr. 12, 2015

(65) Prior Publication Data

US 2016/0299172 A1 Oct. 13, 2016

(51) Int. Cl.
  *G01R 1/067* (2006.01)
  *H01R 13/639* (2006.01)
  *G01R 31/28* (2006.01)
  *H01R 9/05* (2006.01)

(52) U.S. Cl.
  CPC ..... *G01R 1/06772* (2013.01); *G01R 31/2822* (2013.01); *H01R 13/639* (2013.01); *H01R 9/05* (2013.01); *H01R 9/0521* (2013.01)

(58) Field of Classification Search
  CPC ............ G01R 31/2889; G01R 1/06772; G01R 1/06711; G01R 1/0416; G01R 3/00
  USPC .................................................... 324/755.02
  See application file for complete search history.

(56) References Cited

U.S. PATENT DOCUMENTS

| | | | | |
|---|---|---|---|---|
| 1,962,035 A * | 6/1934 | Reiter | ...................... | B42F 13/12 24/105 |
| 4,730,385 A | 3/1988 | Ryan et al. | | |
| 5,017,761 A * | 5/1991 | Brunner | ................... | C21D 1/30 219/494 |
| 6,019,636 A * | 2/2000 | Langham | ............. | H01R 9/0521 439/583 |
| 6,734,689 B1 * | 5/2004 | Yang | .................. | G01R 1/06772 324/755.02 |
| 7,126,360 B1 * | 10/2006 | Yang | .................. | G01R 1/06766 324/754.07 |
| 7,167,011 B2 * | 1/2007 | Yang | .................. | G01R 1/06788 324/754.07 |
| 7,227,352 B2 * | 6/2007 | Aoyagi | .............. | G01R 1/06772 29/825 |
| 7,253,648 B2 * | 8/2007 | Yang | .................. | G01R 1/06788 324/754.07 |
| 7,438,603 B1 * | 10/2008 | Lewis | .................. | G01R 1/0416 439/709 |

(Continued)

OTHER PUBLICATIONS

Hoer, Cletus A. "A high-power dual six-port automatic network analyzer used in determining biological effects of RF and microwave radiation." IEEE Transactions on Microwave Theory and Techniques 29.12 (1981): 1356-1364.*

*Primary Examiner* — Christopher McAndrew (57) ABSTRACT

A coaxial connector locking bracket supports a connection between a coaxial connector and a corresponding mating connector. The locking bracket includes a locking member at one end configured to engage a coupling nut of the coaxial connector and an attachment at an opposite end configured to fix a location of the locking bracket relative to the coaxial connector. The fixed location of the locking bracket is to prevent the coupling nut from rotating about an axis of the coaxial connector. The locking bracket further includes a body connected between the locking member and the attachment.

13 Claims, 4 Drawing Sheets

(56) References Cited

U.S. PATENT DOCUMENTS

| | | | | |
|---|---|---|---|---|
| 7,560,944 | B2* | 7/2009 | Yang | G01R 1/06788 324/756.04 |
| 7,586,318 | B2* | 9/2009 | Yang | G01R 1/06788 324/755.11 |
| 8,333,623 | B2 | 12/2012 | Nickel et al. | |
| 9,148,127 | B1* | 9/2015 | Lee | H03H 7/40 |
| 2005/0212541 | A1* | 9/2005 | Ruff | G01R 1/06788 324/755.02 |
| 2006/0238210 | A1* | 10/2006 | Goto | G01R 31/2889 324/756.03 |
| 2006/0255821 | A1* | 11/2006 | Goto | G01R 31/2889 324/750.14 |
| 2008/0265919 | A1* | 10/2008 | Izadian | G01R 1/045 324/755.01 |
| 2009/0126167 | A1 | 5/2009 | O'Brien et al. | |
| 2011/0025580 | A1* | 2/2011 | Gray | H01R 24/50 343/892 |
| 2011/0312215 | A1* | 12/2011 | Uesaka | G01R 1/06772 439/581 |
| 2011/0318958 | A1* | 12/2011 | Burris | H01R 9/05 439/578 |

\* cited by examiner

COAXIAL CONNECTOR LOCKING BRACKET

CROSS-REFERENCE TO RELATED APPLICATIONS

N/A

STATEMENT REGARDING FEDERALLY SPONSORED RESEARCH OR DEVELOPMENT

N/A

BACKGROUND

Radio frequency (RF) and microwave test and measurement apparatuses and systems typically employ coaxial connectors to one or both of receive signals from a device under test (DUT) and produce signals to be applied to the DUT. The coaxial connectors facilitate convenient and repeated connection and disconnection of the DUT during RF/microwave parameter measurement, for example. Moreover, by using calibration, the effects of the coaxial connector on measurements made by the RF/microwave test and measurement system often can be accounted for and removed from the measurements through RF/microwave calibration.

However, issues may arise in making measurements when the connection provided by the coaxial connector cannot be assured during testing. For example, if DUT testing involves movement of the DUT relative to the RF/microwave test and measurement apparatus, there is a possibility that the RF/microwave calibration may be rendered inaccurate or even ineffective. For example, movement of the DUT may cause movement of the cables connecting the DUT to the RF/microwave test and measurement system. In turn, movement of the cables may lead to loosening or unscrewing of the coaxial connectors reducing the quality of the RF/microwave calibration or even rendering RF/microwave calibration unusable.

BRIEF SUMMARY

In some embodiments, a coaxial connector locking bracket is provided. The coaxial connector locking bracket comprises a locking member configured to engage with a coupling nut of a coaxial connector. The coaxial connector locking bracket further comprises an attachment at an end of the coaxial connector locking bracket opposite the locking member. The attachment is configured to fix a location of the coaxial connector locking bracket relative to the coaxial connector to prevent the coupling nut from rotating about an axis of the coaxial connector. The coaxial connector locking bracket further comprises a body connected between the locking member and the attachment.

In other embodiments, an RF/microwave test apparatus having a coaxial connector lock is provided. The RF/microwave test apparatus comprises a test port connector mounted in a connector panel. The RF/microwave test apparatus further comprises a coaxial connector locking bracket configured to engage a coupling nut of a coaxial connector connected to the test port connector and to substantially prevent rotation of the coupling nut. The coupling nut engagement by the locking bracket is configured to maintain an integrity of the connection between the coaxial connector and the test port connector.

In other embodiments, a method of locking a coaxial connector onto a mating connector is provided. The method of locking a coaxial connector comprises connecting the coaxial connector to a mating coaxial connector by tightening a coupling nut of the coaxial connector onto the mating coaxial connector. The method of locking a coaxial connector further comprises engaging the coupling nut using a coaxial connector locking bracket. The method of locking a coaxial connector further comprises attaching the coaxial connector locking bracket to one or both of the mating coaxial connector and a connector panel that supports the mating coaxial connector.

BRIEF DESCRIPTION OF THE DRAWINGS

Various features of embodiments and examples in accordance with the principles described herein may be more readily understood with reference to the following detailed description taken in conjunction with the accompanying drawings, where like reference numerals designate like structural elements, and in which.

Certain examples and embodiments have other features that are one of in addition to and in lieu of the features illustrated in the above-referenced figures. These and other features are detailed below with reference to the above-referenced figures.

DETAILED DESCRIPTION

Embodiments and examples consistent with the principles described herein provide a connector locking bracket used with a coaxial connector to prevent movement or rotation of the coaxial connector when connected to a mating connector. In particular, embodiments include a coaxial connector locking bracket having a locking member at a first end to engage a coupling nut of the coaxial connector and an attachment at a second end opposite the locking member to fix a location or position of the coaxial connector locking bracket relative to the coaxial connector. According to various embodiments, the coaxial connector locking bracket is used with an RF/microwave test apparatus or similar system to maintain an integrity of a connection between the coaxial connector and a test port connector of the RF/microwave test apparatus.

As used herein, the article 'a' is intended to have its ordinary meaning in the patent arts, namely 'one or more'. For example, 'a connector' means one or more connectors and as such, 'the connector' means 'the connector(s)' herein. Also, any reference herein to 'top', 'bottom', 'upper', 'lower', 'up', 'down', 'front', back', 'first', 'second', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Further, herein the term 'substantially' as used herein means a majority, or almost all, or all, or an amount within a range of about 51% to about 100%, for example. Moreover, examples herein are intended to be illustrative only and are presented for discussion purposes and not by way of limitation.

In accordance with some embodiments of the principles described herein, a coaxial connector locking bracket is provided. The coaxial connector locking bracket may be used to secure or insure the integrity of a connection between a coaxial connector and a corresponding mating connector (e.g., another coaxial connector). In particular, the coaxial connector locking bracket may be used to substantially maintain a coupling or connection between the coaxial connector and the mating connector.

Figure 1A:
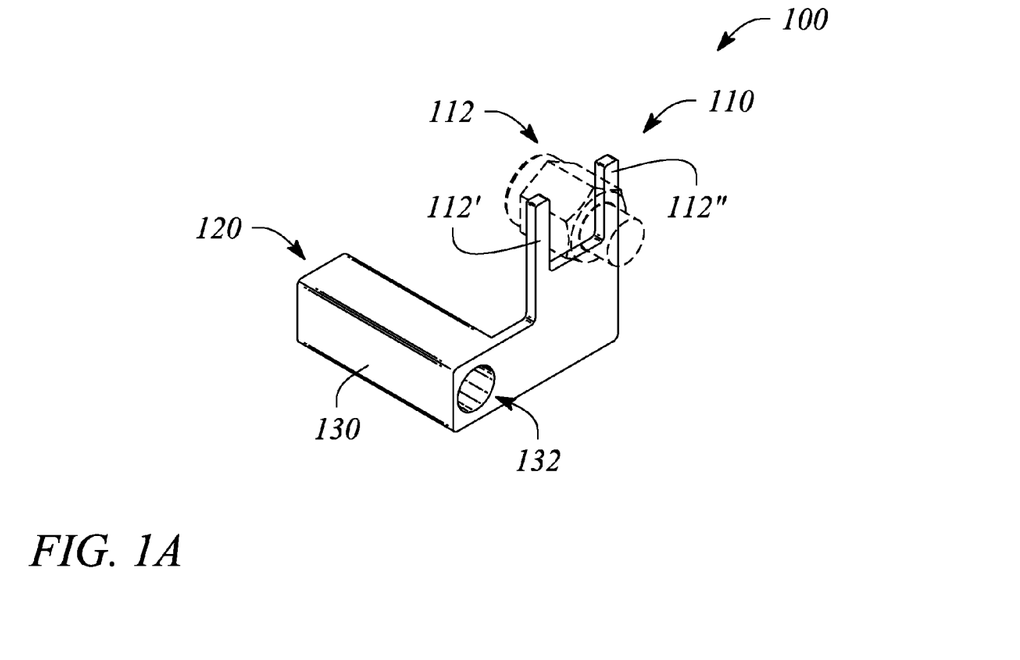
FIG. 1A illustrates a perspective view of a coaxial connector locking bracket in an example, according to an embodiment consistent with the principles described herein.
Figure 1B:
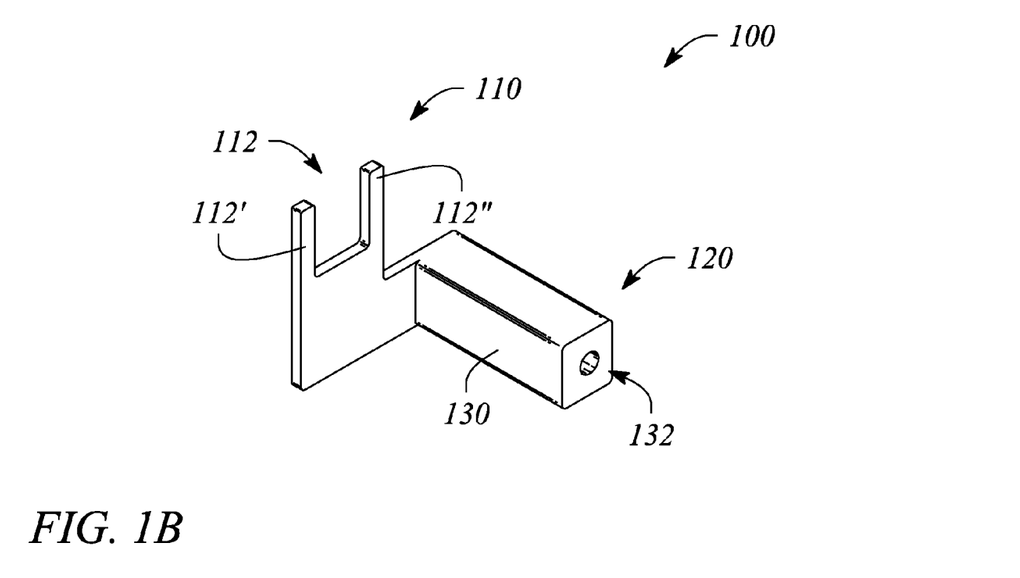
FIG. 1B illustrates another perspective view of the coaxial connector locking bracket of FIG. 1A in an example, according to an embodiment consistent with the principles described herein.
Figure 1C:
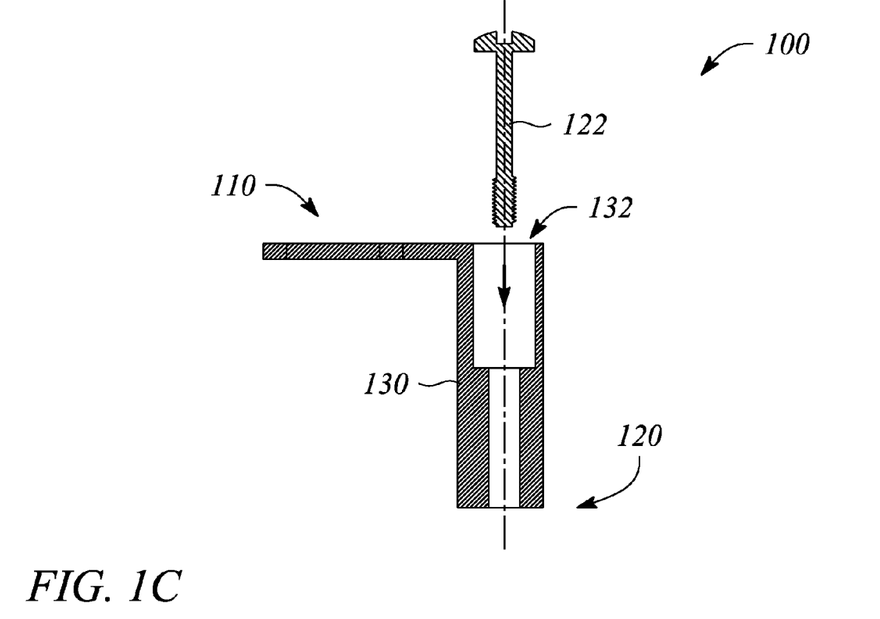
FIG. 1C illustrates a cross sectional view of the coaxial connector locking bracket of FIGS. 1A and 1B in an example, according to an embodiment consistent with the principles described herein.

FIG. 1A illustrates a perspective view of a coaxial connector locking bracket 100 in an example, according to an embodiment consistent with the principles described herein. FIG. 1B illustrates another perspective view of the coaxial connector locking bracket 100 of FIG. 1A in an example, according to an embodiment consistent with the principles described herein. FIG. 1C illustrates a cross sectional view of the coaxial connector locking bracket 100 of FIGS. 1A and 1B in an example, according to an embodiment consistent with the principles described herein.

As illustrated in FIGS. 1A-1C, the coaxial connector locking bracket 100 comprises a locking member 110. The locking member 110 is configured to engage or engage with a coupling nut of a coaxial connector. The coaxial connector may be substantially any coaxial connector or coaxial connector system that has a coupling nut or similar securing mechanism including, but not limited to, a sub-miniature type radio frequency (RF) and microwave coaxial connector, a precision RF/microwave connector or a related coaxial connector. For example, the sub-miniature type RF/microwave connector having a coupling nut may include, but is not limited to, a subminiature version A or 'SMA' connector, a 3.5 mm (e.g., APC3.5) connector, 2.92 mm connector, a 2.4 mm connector, a 1.85 mm connector, or a 1.0 mm connector. The coupling nut may be on a male connector in the sub-miniature type RF/microwave connector, for example. A precision RF/microwave connector having a coupling nut includes, but is not limited to, an APC-7 or 7 mm connector.

According to various embodiments, the locking member 110 may engage the coupling nut by applying or at least being capable of applying a physical force to the coupling nut (e.g., a hex nut). In some embodiments (e.g., as illustrated), the locking member 110 may comprise a jaw 112 or similar structure having opposing surfaces 112', 112". The jaw 112 may be a wrench-like jaw similar to a jaw of an open-end wrench, for example. In particular, the opposing surfaces 112', 112" of the jaw 112 are configured to capture and engage the coupling nut at corresponding opposing flat surfaces of the coupling nut, for example. A coupling nut engaged at opposing flat surfaces 112', 112" of the jaw 112 of the locking member 110 is illustrated using a dashed outline in FIG. 1A by way of example and not limitation.

In some embodiments, the locking member jaw 112 may comprise a metal (e.g., a rigid metal plate) and have a pair of fingers having the opposing surfaces 112', 112" (i.e., the fingers 112', 112") spaced apart from one another by a distance sufficient to provide clearance to fit over and capture the coupling nut at a pair of opposing flat surfaces of the coupling nut. For example, when the coaxial connector is one of an SMA connector, a 3.5 mm connector, or a 2.92 mm connector, the coupling nuts on these connectors are about the same size and are accommodated by a 5/16-inch open-end wrench used to tighten and loosen the coupling nuts thereof. In some embodiments, the jaw fingers 112', 112" of the locking member 110 are spaced apart from one another to approximate the 5/16-inch open-end wrench to engage the coupling nut of any of these connectors. In another embodiment, the jaw fingers 112', 112" of the locking member 110 are spaced apart from one another to approximate a 3/4-inch open-end wrench when the coaxial connector is an APC-7 connector with coupling nut having a size that is accommodated by a 3/4-inch open-end wrench used to tighten and loosen the coupling nut, for example. In some embodiments, the locking member jaw spacing of a respective coaxial connector locking bracket 100 is fixed and may be sized or specified to independently accommodate a different one of a variety of coaxial connectors, such as those listed above. The metal of the locking member jaw 112 plate may include, but is not limited to, stainless steel, for example.

In other embodiments, the locking member jaw 112 may comprise another material including, but not limited to, a rigid plastic or polymer (e.g., nylon). A rigid plastic or polymer jaw 112 may include spaced apart fingers 112', 112" with opposing flat surfaces analogous to those of the metal-based (e.g., metal plate-based) jaw 112, for example. In yet other embodiments (not illustrated), the locking member jaw may comprises a single 'finger' to bear against a single flat surface of the coupling nut, for example. In some embodiments, the locking member jaw 112 may be adjustable (e.g., similar to an adjustable wrench) to accommodate coupling nuts of differing sizes.

In some embodiments (not illustrated), the locking member (e.g., the jaw of the locking member) may comprise one of a spring clamp and a set screw to bear against a surface of the corresponding opposing surfaces of the coupling nut. For example, the fingers of the locking member jaw may be spring flanges configured to flex and provide a bearing force when connected to the coupling nut. In another example, the jaw fingers may include spring members (e.g., within a surface of the fingers). The set screw may be embedded in the jaw finger and configured to bear against the coupling nut surface when tightened, for example. The spring clamp or the set screw (or both) may further help to retain the jaw on the coupling nut, according to some embodiments.

The coaxial connector locking bracket 100 illustrated in FIGS. 1A-1C further comprises an attachment 120 or attachment member at an end of the coaxial connector locking bracket 100 opposite the locking member 110. The attachment 120 is configured to fix a location or position of the coaxial connector locking bracket 100 relative to the coaxial connector to prevent the coupling nut from rotating about an axis of the coaxial connector. In particular, the location or position is configured to be fixed to insure that the coaxial connector coupling nut is substantially prevented from rotating when the locking member 110 is engaged. According to various embodiments, by substantially preventing rotation of the coupling nut, the locking member 110 may maintain the integrity of the coaxial connector coupling between the coaxial connector and a respective corresponding mating connector. Any of a variety of means for attaching may be used for the attachment 120, according to various embodiments.

In some embodiments, the attachment 120 comprises a fastener 122 configured to connect the coaxial connector locking bracket 100 to a panel or similar mounting surface. For example, the panel may be a connector panel (e.g., of an RF/microwave test apparatus) in which the mating connector is mounted. The fastener 122 may include, but is not limited to, a screw, a snap or a pin that may be inserted into a corresponding fastener receiver in the connector panel to fix a location or position of the coaxial connector locking bracket 100. For example, as illustrated in FIG. 1C, the fastener 122 may comprise a screw or a bolt configured to be inserted through a counter-bore (e.g., indicated by an bold arrow) of the locking bracket 100 and into a corresponding threaded hole in the connector panel to fix the coaxial connector locking bracket 100 to the connector panel (not illustrated). In another example, the connector panel may include a socket and the fastener may be a pin configured to be inserted into the socket in the connector panel. In yet other examples, the coaxial connector locking bracket 100 itself may be configured to be inserted into a socket or similar structure in the connector panel to act as the attachment 120 (e.g., without a separate fastener).

Figure 2:
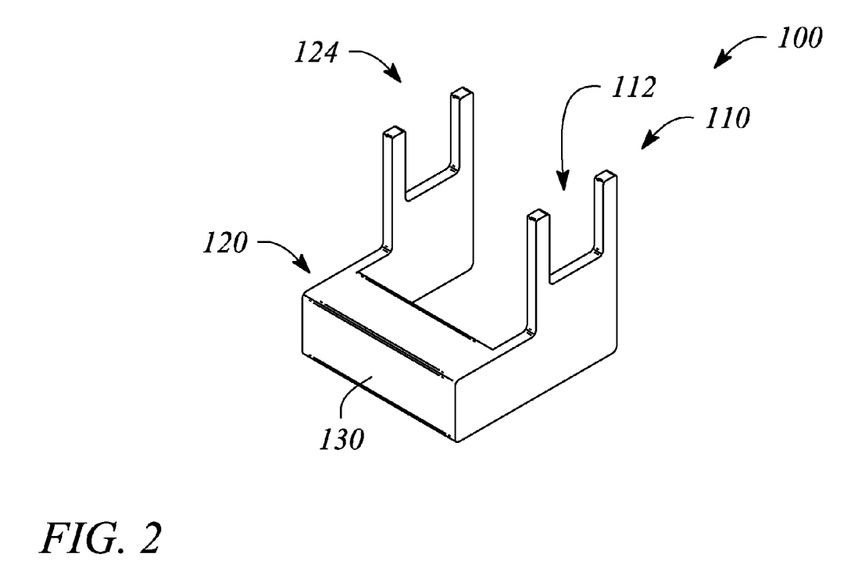
FIG. 2 illustrates a perspective view of a coaxial connector locking bracket in an example, according to another embodiment consistent with the principles described herein.

In other embodiments, the attachment 120 may comprise another locking member configured to engage a nut of the mating connector corresponding to the coaxial connector. FIG. 2 illustrates a perspective view of a coaxial connector locking bracket 100 in an example, according to another embodiment consistent with the principles described herein. In particular, as illustrated in FIG. 2, the coaxial connector locking bracket 100 comprises the locking member 110 (e.g., the jaw 112) to engage the coupling nut of the coaxial connector, as described above. Further, the coaxial connector locking bracket 100 comprises the attachment 120, which in turn comprises a second locking member 124, according to this embodiment, to fix the location or position of the coaxial connector locking bracket 100. In some embodiments, the second locking member 124 is configured (i.e., sized) to accommodate and fit to the mating connector nut. In some embodiments, the locking member 124 may be substantially similar to the locking member 110. For example, the locking member 124 may include a jaw that is sized to fit a 5/16 inch hex connector nut to capture or secure to a mating connector that has a 5/16 inch hex mating connector nut or similar structure. As such, the locking member 110 or jaw 112 thereof is configured to engage the coupling nut of the coaxial connector and the other locking member 124 is configured to engage the corresponding mating connector nut to prevent relative rotation of the coupling nut and mating connector nut to insure and maintain connection integrity.

According to various embodiments (e.g., as illustrated in FIGS. 1A-1C and 2), the coaxial connector locking bracket 100 further comprises a body 130. The body 130 is connected between the locking member 110 to the attachment 120. In particular, the body 130 both mechanically connects and may also provide a spacing between the locking member 110 and the attachment 120. The spacing may selectively position the locking member 110 relative to the attachment 120 to facilitate engagement of the connector coupling nut, for example. In addition, the body 130 may provide for or facilitate the attachment 120. For example, as illustrated in FIG. 1C, the fastener 122 is a screw and the body 130 has a counter-bore 132 and a through-hole to accommodate the screw 122. In some examples, the provided spacing may be fixed, while in other examples the spacing may be adjustable to accommodate differing applications of the coaxial connector locking bracket 100 (e.g., different coaxial connector mating configurations).

In some embodiments, the body 130 may comprise a column, post or similar structure. FIGS. 1A-1C illustrate the body 130 as an elongated post, for example. The post may include the counter-bore 132 and hole through a central portion thereof, for example. In other embodiments, the body 130 may comprise a plate or another similar structure (e.g., instead of the post) to mechanically connect and space apart the locking member 110 and the attachment 120. For example, the plate of the locking member jaw 112 may be continued (e.g., with an appropriate bend) to provide the spacing and mechanical connection between the locking member 110 and the attachment 120. The attachment 120 may further comprise the extended plate having a second bend at the attachment 120, e.g., through which a screw may be inserted and fastened into the connector panel. The space provided by the body 130 between the locking member 110 and the attachment 120 is configured to accommodate a respective distance between the coaxial connector nut at the locking member 110 end and the connector panel at the attachment 120 end, according to some examples.

Figure 3:
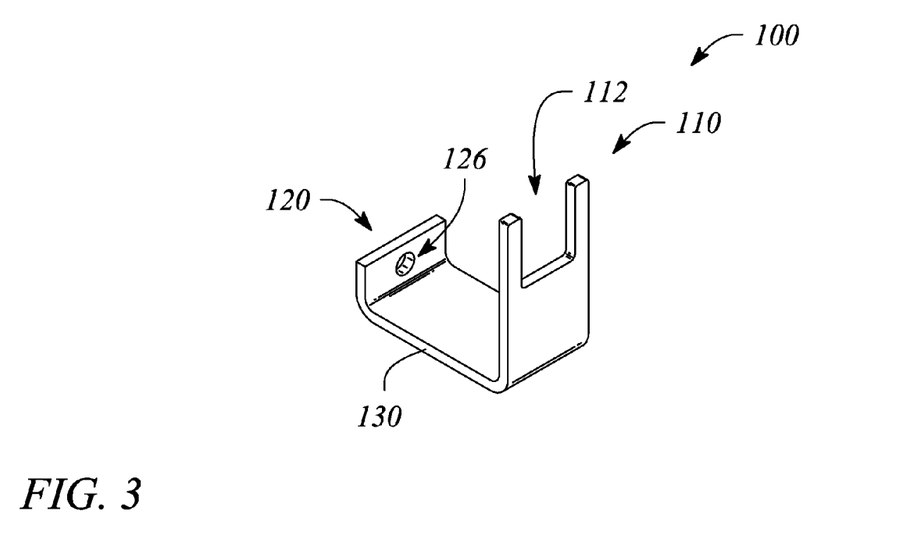
FIG. 3 illustrates a perspective view of a coaxial connector locking bracket in an example, according to another embodiment consistent with the principles described herein.

FIG. 3 illustrates a perspective view of a coaxial connector locking bracket 100 in an example, according to another embodiment consistent with the principles described herein. In particular, as illustrated in FIG. 3, the coaxial connector locking bracket 100 comprises a plate having two bends. In some examples, the plate includes a rigid metal material. A portion of the plate at a first bend forms the jaw 112 of the locking member 110 to capture and engage the connector coupling nut. The second bend is spaced apart from the first bend and forms the attachment 120 comprising a portion of the plate having a hole 126 to accommodate a fastener (not illustrated in FIG. 3) that is configured to the connector panel that includes the corresponding mating connector. For example, the fastener may be a screw or bolt, for example, the fastener 122 described above. The body 130 comprises a portion of the plate between the locking member 110 and the attachment 120, as illustrated in FIG. 3.

Figure 4:
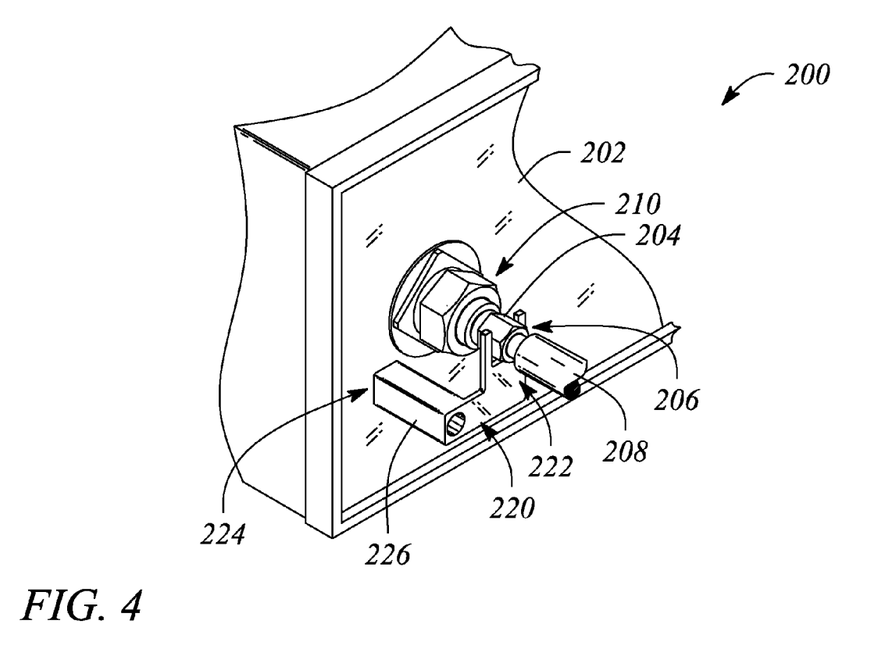
FIG. 4 illustrates a perspective view of an RF/microwave test apparatus having a coaxial connector lock in an example, according to an embodiment consistent with the principles described herein.

In some embodiments according to the principles described herein, an RF/microwave test apparatus having a coaxial connector lock is provided. FIG. 4 illustrates a perspective view of an RF/microwave test apparatus 200 having a coaxial connector lock in an example, according to an embodiment consistent with the principles described herein. For example, the RF/microwave test apparatus 200 may represent a network analyzer, a spectrum analyzer, an RF/microwave signal generator or any of a variety of RF/microwave test and measurement systems.

As illustrated in FIG. 4, the RF/microwave test apparatus 200 having a coaxial connector lock comprises a test port connector 210. The test port connector 210 may be mounted in a connector panel 202 of the RF/microwave test apparatus 200, as illustrated. For example, the RF/microwave test apparatus 200 may comprise a network analyzer such as, but not limited to, an N5222A PNA Microwave Network Analyzer, which is a product of Keysight Technologies, Inc. of Santa Rosa, Calif., USA. The test port connector 210 may be 3.5 mm collet-style female connector of the N5222A PNA Microwave Network Analyzer mounted in a front panel thereof (i.e., the connector panel 202), for example.

The RF/microwave test apparatus 200 further comprises a coaxial connector locking bracket 220. The coaxial connector locking bracket 220 is configured to engage a coupling nut 204 of a coaxial connector 206 connected to the test port connector 210 and to prevent or substantially prevent rotation of the coupling nut 204. In particular, the coupling nut engagement by locking bracket 220 is configured to maintain an integrity of the connection between the coaxial connector 206 and the test port connector 210, according to various embodiments. According to some embodiments, the coaxial connector locking bracket 220 may be substantially similar to the coaxial connector locking bracket 100, described above. For example, the coaxial connector locking bracket 220 illustrated in FIG. 4 is substantially similar to the coaxial connector locking bracket 100 illustrated in FIGS. 1A-1C. However, any of the coaxial connector locking brackets 100 illustrated in FIGS. 2-3 may be used. As illustrated, the coaxial connector 206 is connected to a coaxial cable 208 (e.g., a test cable used with the RF/microwave test apparatus 200).

In particular, in some embodiments, the coaxial connector locking bracket 220 may comprises a locking member 222 at a first end of the coaxial connector locking bracket 220, an attachment 224 at a second end of the coaxial connector locking bracket 220, and a body 226 between the locking member 222 and the attachment 224. According to various embodiments, the locking member 222 is configured to capture and engage the coupling nut 204 to prevent or substantially prevent rotation thereof. For example, the locking member 222 may be substantially similar to the locking member 110 described above with respect to the coaxial connector locking bracket 100. In particular, the locking member 222 may comprise a jaw (e.g., a rigid plate) having a pair of fingers spaced apart from one another by a distance sufficient to provide clearance to fit over and capture the coupling nut 204 of the coaxial connector 206 at respective flat portions of the corresponding opposing surfaces of the coupling nut 204, for example.

Further, the attachment 224 may be substantially similar to the attachment 120 of the coaxial connector locking bracket 100, described above. For example, according to some embodiments, the attachment 224 is configured to connect the coaxial connector locking bracket 220 to the connector panel 202. In particular, the attachment 224 may comprises a fastener such as, but not limited to, a screw, bolt, peg or snap, to connect the coaxial connector locking bracket 220 to the connector panel 202 of the RF/microwave test apparatus 200, e.g., as illustrated in FIG. 4. In other examples, the attachment 224 is configured to connect the coaxial connector locking bracket 220 to the test port connector 210. The test port connector 210 may be a collet-nut style coaxial connector and in these examples, the attachment 224 may include a second locking member (not illustrated) to capture and engage opposing surfaces of a hex nut portion of the collet-nut style coaxial test port connector 210 (e.g., see FIG. 2, described above with reference to locking member 124). In yet other examples, the attachment 224 may connect the coaxial connector locking bracket 220 to both the connector panel 202 and the test port connector 210.

Further, the body 226 may be substantially similar to the body 130 described above with respect to the coaxial connector locking bracket 100. For example, the body 226 may comprise a support (e.g., a post, a plate or a similar structure). The body 226 is configured to space apart the locking member 222 and the attachment 224 a requisite distance that is substantially equivalent to a distance between the installed coupling nut 204 of the coaxial connector 206 and either the connector panel 202 of the RF/microwave test apparatus 200 or the test port connector 210, depending on the embodiment. In some embodiments, the body 226 may have a fixed (e.g., predetermined) length determined by a particular application or requisite distance, while in other embodiments the length of the body 226 or equivalently the spaced apart distance provided by the body 226 may be adjustable. In addition, the body 226 may facilitate the attachment 224 by supporting a fastener (e.g., a screw within a counter-bore through a post, as illustrated in FIG. 1C), for example.

Figure 5:
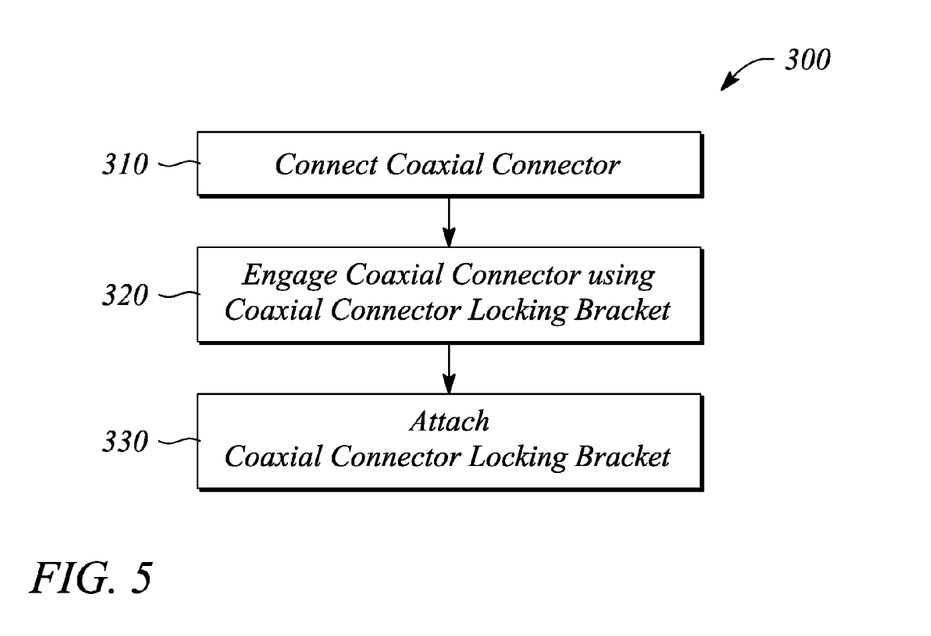
FIG. 5 illustrates a flow chart of a method of locking a coaxial connector onto a mating connector in an example, according to an embodiment of the principles describe herein.

In some embodiments according to the principles described herein, a method of locking a coaxial connector onto a mating connector is provided. FIG. 5 illustrates a flow chart of a method 300 of locking a coaxial connector onto a mating connector in an example, according to an embodiment of the principles describe herein. As illustrated, the method 300 comprises connecting 310 a coaxial connector to the mating coaxial connector. For example, connecting 310 the coaxial connector may be accomplished by tightening a coupling nut of the coaxial connector onto the mating connector. Connecting 310 the coaxial connector may include one or both of rotating the coupling nut of the coaxial connector and rotating a coupling nut of the mating connector. Connecting 310 the coaxial connector may comprise employing a torque wrench having a torque setting determined by a specification of the coaxial connector, for example.

As illustrated in FIG. 5, the method 300 of locking a coaxial connector onto a mating connector further comprises engaging 320 the coupling nut of the coaxial connector using a coaxial connector locking bracket. According to some embodiments, the coaxial connector locking bracket may be substantially similar to the coaxial connector locking bracket 100, described above. For example, engaging 320 the coupling nut may comprise capturing the coupling nut between a pair of opposing surfaces of a jaw of the coaxial connector locking bracket. The jaw may be substantially similar to the jaw 112 described above with respect to the coaxial connector locking bracket 100, for example. In another example, engaging 320 the coupling nut may further comprise bearing on a surface of the coupling nut with physical pressure provided by one or more of a spring clamp and a set screw, for example. In some embodiments, engaging 320 the coupling nut is performed after connecting 310 the coaxial connector (e.g., as illustrated in FIG. 5). In other embodiments, engaging 320 the coupling nut may be performed before or even simultaneous with connecting 310 the coaxial connector The method 300 of locking a coaxial connector onto a mating connector illustrated in FIG. 5 further comprises attaching 330 the coaxial connector locking bracket to one or both of the mating connector and a connector panel that supports or mounts the mating connector. According to some embodiments, the connector panel is a front panel of an RF/microwave test apparatus including, but not limited to, a network analyzer wherein the mating connector may be a collet-style test port connector of the network analyzer. According to some embodiments (e.g., as illustrated in FIG. 5), attaching 330 the coaxial connector locking bracket may be performed after engaging 320 the coupling nut. In other embodiments, attaching 330 the coaxial connector locking bracket may be performed prior to or even simultaneously with engaging 320 the coupling nut.

According to some embodiments, attaching 330 the coaxial connector locking bracket may employ an attachment that is substantially similar to the attachment 120 of the above-described coaxial connector locking bracket 100. In some embodiments, the coaxial connector locking bracket is attached to the connector panel and attaching 330 the coaxial connector locking bracket may comprise inserting a fastener through the coaxial connector locking bracket and into a corresponding hole or receptacle in the connector panel that supports or mounts the mating connector to fixably attach to the connector panel. The fastener may comprise a screw or a bolt, and the receiving hole may be a threaded hole in the connector panel, for example. In some embodiments, the coaxial connector locking bracket is attached to the mating connector and attaching 330 the coaxial connector locking bracket may comprise engaging a nut of the mating connector to fixably attach to the mating connector. For example, the coaxial connector locking bracket may include a second locking member configured to capture and engage the mating connector nut, e.g., substantially similar to the coaxial connector locking bracket 100 in FIG. 2, as described above. According to various embodiments, the method 300 of locking a coaxial connector onto a mating connector facilitates maintaining an integrity of a connection between the coaxial connector and a test port connector of the respective RF/microwave test apparatus.

Thus, there have been described examples and embodiments of a coaxial connector locking bracket and an RF/microwave test apparatus and a method of locking a coaxial connector onto a mating connector that employ the coaxial connector locking bracket to engage and substantially prevent rotation of a coupling nut of the coaxial connector. It should be understood that the above-described examples are merely illustrative of some of the many specific embodiments and examples that represent the principles described herein. Clearly, those skilled in the art can readily devise numerous other arrangements without departing from the scope as defined by the following claims.

What is claimed is:

1. A coaxial connector locking bracket comprising:
a locking member configured to engage with a coupling nut of a coaxial connector;
an attachment at an end of the coaxial connector locking bracket opposite the locking member, the attachment being configured to fix a location of the coaxial connector locking bracket relative to the coaxial connector to prevent the coupling nut from rotating about an axis of the coaxial connector, wherein the attachment is adapted to be disposed flush with a mounting surface; and
a body connected between the locking member and the attachment, the body comprising a counter-bore and a through-hole configured to receive a fastener.

2. The coaxial connector locking bracket of claim 1, wherein the locking member comprises a jaw having opposing surfaces configured to capture and engage the coupling nut at corresponding opposing surfaces of the coupling nut.

3. The coaxial connector locking bracket of claim 2, wherein the locking member jaw comprises a metal plate having a pair of fingers spaced apart from one another by a distance sufficient to provide clearance to fit over and capture the coupling nut at respective flat portions of the corresponding opposing surfaces.

4. The coaxial connector locking bracket of claim 2, wherein the locking member jaw comprises one of a spring clamp and a set screw to bear against a surface of the corresponding opposing surfaces of the coupling nut.

5. The coaxial connector locking bracket of claim 1, wherein the attachment comprises a fastener configured to connect the coaxial connector locking bracket to a connector panel.

6. The coaxial connector locking bracket of claim 5, wherein the fastener comprises a screw, and wherein the body comprises a post having a counter-bore to accommodate the screw.

7. The coaxial connector locking bracket of claim 1, wherein the attachment comprises another locking member configured to engage a nut of a mating connector corresponding to the coaxial connector.

8. The coaxial connector locking bracket of claim 7, wherein the mating connector comprises a collet nut of a test port connector mounted in a connector panel.

9. An RF/microwave test apparatus having a coaxial connector lock comprising:
a test port connector mounted in a connector panel; and
a coaxial connector locking bracket configured to engage a coupling nut of a coaxial connector connected to the test port connector and to substantially prevent rotation of the coupling nut, the coaxial connector locking bracket comprising:
a locking member at a first end of the locking bracket, the locking member being configured to capture and engage the coupling nut;
an attachment at a second end of the locking bracket, the attachment being configured to one or both of connect the coaxial connector locking bracket to the connector panel and connect the coaxial connector locking bracket to the test port connector, wherein the attachment is adapted to be disposed flush with the connector panel; and
a body connected between the attachment and the locking member, the body comprising a counter-bore and a through-hole configured to receive a fastener,
wherein the coupling nut engagement by the locking bracket is configured to maintain an integrity of the connection between the coaxial connector and the test port connector.

10. The RF/microwave test apparatus of claim 9, wherein the locking member comprises a jaw having a pair of fingers spaced apart from one another by a distance sufficient to provide clearance to fit over and capture the coupling nut at a pair of opposing flat surfaces of the coupling nut.

11. The RF/microwave test apparatus of claim 9, wherein the attachment comprises a fastener to connect the coaxial connector locking bracket to the connector panel of the RF/microwave test apparatus.

12. The RF/microwave test apparatus of claim 9, wherein the test port connector comprises a collet-nut style coaxial connector.

13. The RF/microwave test apparatus of claim 9, wherein the RF/microwave test apparatus comprises a network analyzer.

* * * * *